US 6,531,756 B1

(12) United States Patent
Huggins

(10) Patent No.: US 6,531,756 B1
(45) Date of Patent: *Mar. 11, 2003

(54) LASER FUSE AND ANTIFUSE STRUCTURES FORMED OVER THE ACTIVE CIRCUITRY OF AN INTEGRATED CIRCUIT

(75) Inventor: Alan H. Huggins, Santa Clara, CA (US)

(73) Assignee: Clear Logic, Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/405,978

(22) Filed: Sep. 27, 1999

Related U.S. Application Data

(62) Division of application No. 08/822,551, filed on Mar. 19, 1997.

(51) Int. Cl.[7] ............................................. H01L 27/148
(52) U.S. Cl. ....................... 257/529; 257/529; 257/530
(58) Field of Search ................................. 257/529, 530

(56) References Cited

U.S. PATENT DOCUMENTS

| | | | | |
|---|---|---|---|---|
| 4,272,775 A | * | 6/1981 | Compton et al. ............. | 357/29 |
| 4,455,194 A | | 6/1984 | Yabu et al. .................. | 156/653 |
| 4,536,948 A | | 8/1985 | Te Velde et al. ............. | 29/577 |
| 4,581,628 A | | 4/1986 | Miyauchi et al. ............. | 357/84 |
| 4,602,420 A | | 7/1986 | Saito ........................... | 29/571 |
| 5,025,300 A | | 6/1991 | Billig et al. ................... | 357/51 |
| 5,070,384 A | * | 12/1991 | McCollum et al. ............ | 357/51 |
| 5,087,958 A | * | 2/1992 | Chen et al. .................... | 357/51 |
| 5,120,679 A | * | 6/1992 | Boardman et al. ........... | 437/195 |
| 5,223,735 A | | 6/1993 | Kinoshita et al. ............. | 257/409 |
| 5,264,725 A | * | 11/1993 | Mullarkey et al. ........... | 257/665 |
| 5,279,984 A | | 1/1994 | Kinoshita et al. ............. | 437/52 |
| 5,360,988 A | * | 11/1994 | Uda et al. ..................... | 257/529 |
| 5,374,832 A | * | 12/1994 | Tung et al. .................... | 257/50 |
| 5,387,812 A | * | 2/1995 | Forouhi et al. ............... | 257/530 |
| 5,420,455 A | * | 5/1995 | Gilmour et al. ............. | 257/529 |
| 5,475,253 A | * | 12/1995 | Look et al. .................. | 257/530 |
| 5,608,257 A | | 3/1997 | Lee et al. ..................... | 257/529 |
| 5,986,319 A | * | 11/1999 | Huggins ....................... | 257/529 |

FOREIGN PATENT DOCUMENTS

| | | | | |
|---|---|---|---|---|
| DE | 3223619 A1 | 2/1983 | ................. | 257/665 |
| JP | 56-99406 | 6/1981 | ................. | 257/665 |

\* cited by examiner

Primary Examiner—Carl Whitehead, Jr.
Assistant Examiner—C. Johnson
(74) Attorney, Agent, or Firm—Howrey Simon Arnold & White, LLP

(57) ABSTRACT

In an integrated circuit where one desires the most compact arrangement of fuses and active circuitry, an insulating layer is deposited over active circuitry which includes the associated interconnect layers. A protective layer made with a reflective material may be used as a conductive layer above the lower layers of the integrated circuit containing active circuitry which includes interconnect layers of any desired number. This protective layer is patterned below the areas that will later contain fuses (or antifuses or both). Above this protective layer another insulating layer is deposited. A fuse layer which may be metal or another conductive film is then deposited. This conductive layer is patterned to provide the desired fuses (and/or antifuses) as required, with some or all of the fuses aligned with the protective layer deposited underneath. The protective layer is patterned such that the area of the protective layer underneath the fuses will absorb and/or deflect much of the radiant energy that does not directly impinge upon the fuses.

9 Claims, 7 Drawing Sheets

LASER FUSE AND ANTIFUSE STRUCTURES FORMED OVER THE ACTIVE CIRCUITRY OF AN INTEGRATED CIRCUIT

This application is a division of application Ser. No. 08/822,551, filed Mar. 19, 1997.

FIELD OF THE INVENTION

The present invention relates to the customization of electronic devices using radiant energy to configure fuses. More particularly, the present invention relates to a compact arrangement of fuses and active circuitry on an integrated circuit.

BACKGROUND OF THE INVENTION

Fuses and antifuses have been used in the manufacture and repair of integrated circuits for some time. The word fuse will be used throughout this specification to mean fuse, antifuse, or both. The uses of fuses have been in: (1) the repair of circuits through the selective addition and deletion (or substitution) of circuitry to repair bad portions of circuitry; (2) the marking of units for identification; (3) the customization of circuits by altering their structure, paths, or electrical characteristics. It has been common for a fuse to have an open area above the fuse to allow for the application of a radiant energy beam to the fuse from above the integrated circuit. It has also been common for the area around the fuse to be free of active circuitry (transistors, resistors, signal lines, junctions, etc.) for a distance larger than the minimum feature dimensions of the process used. The reason for this practice is that the spot size of the radiant energy beam has been larger than the feature size of the fuse, and the nearby circuitry could not be subjected to the heat of that radiant energy pulse, for fear that it would be damaged. Additionally, the area below the fuse has been kept clear of active circuitry (transistors, resistors, signal lines, junctions, etc.) for fear that the radiant energy used to configure the fuse would damage this active circuitry. Thus, the use of radiant energy configurable fuses for custom integrated circuits will increase the overall chip area of the integrated circuit since active circuitry could not be placed underneath or near these fuses.

SUMMARY OF THE INVENTION

There is therefore a need for increasing the density of the integrated circuit that utilizes radiant energy to configure fuses.

Accordingly, it is a feature of the present invention to increase the density of the integrated circuit by allowing active circuitry below the beam area of the radiant energy used to configure the fuses.

It is another feature of the invention to enable the use of higher energy radiant energy beams for improved fusing by protecting the active circuitry from the radiant energy used to configure the fuses.

It is another feature of this invention to enable the fuses to be made with materials that require higher radiant energy to configure them by protecting the active circuitry from the radiant energy used to configure the fuses.

Another feature of the present invention is to allow the area around the fuse to be cleaned up with one or more additional radiant energy pulses, with the reflected energy from the protective layer providing a more complete removal of the fuse material.

It is yet another feature of the invention to provide protection of the underlying active circuitry from the energy of the clean-up pulse since the fuse is no longer present to absorb the radiant energy.

These and other related features are achieved through the use of the novel protection method and integrated circuit structure disclosed. In accordance with an aspect of the present invention, an integrated circuit where one desires the most compact arrangement of fuses and active circuitry, an insulating layer is deposited over active circuitry which includes the associated interconnect layers. The insulating layer may be planarized or not. Optional vias may be etched at this time or later to a lower conducting surface for interconnection. A protective layer made with a substantially non-transmissive material, preferably a reflective material (aluminum, titanium or the like), is disposed above the lower layers of the integrated circuit containing active circuitry which includes interconnect layers of any desired number. This protective layer, which may also be used as a conductive interconnect layer, is patterned below the areas that will later contain fuses. Above this protective layer another insulating layer is deposited. A fuse layer may be metal or another conductive film such as polysilicon, amorphous polysilicon, silicide, or other suitable material for a fuse is then deposited. This conductive layer is patterned to provide the desired fuses as required, with some or all of the fuses aligned with the protective layer deposited underneath. The protective layer is patterned such that the area of the protective layer underneath the fuses will absorb and/or deflect much of the radiant energy that does not directly impinge upon the fuses.

In accordance with another aspect of the invention, an integrated circuit comprises active circuitry and a first insulating layer overlaying the active circuitry. A fuse layer is disposed above the first insulating layer, and includes at least one fuse. The fuse is radiant-energy configurable, and has a location such that the beam area of the radiant energy used to configure the fuse overlaps the active circuitry. A first protective layer is underneath the fuse, and is sufficiently large to shield the active circuitry from the radiant energy not directly impinging upon the fuse. A second insulating layer is disposed between the protective layer and the fuse.

In accordance with another aspect of this invention, a method for protecting active circuitry on an integrated circuit from radiant energy used to configure the integrated circuit comprises the steps of providing a fuse layer having at least one fuse and providing a protective layer underneath the fuse. The fuse has a location such that the beam area of the radiant energy used to configure the fuse overlaps the active circuitry. The method further includes the step of configuring at least one of the fuses using radiant energy.

In one embodiment the protective layer is used as a conductor, such as a power, a ground conductor, or other lines that preferably are not minimum dimension lines, further increasing the conductor packing efficiency and usefulness of the protective layer.

In another embodiment the protective layer may be made of more than one material to increase its protective capability or to perform another useful purpose such as a capacitor structure. For instance, the protective layer may comprise sandwiches of various materials designed to better reflect or absorb the radiant energy without damage.

In yet another embodiment the protective plate may be formed under the fuse in such a manner that it is tilted from the horizontal on one or both sides of the fuse, and it may include more than one piece. In this configuration, the radiant energy that misses the fuse off to one or both sides may be reflected back to the underside of the fuse. It also allows more of the incident radiant energy to be directed to the fuse than would normally be captured by the width of the fuse itself. This configuration further allows the fuse to be heated from both the top and the bottom to more completely configure the fuse.

It has been common for interconnect layers to be formed with insulating layers between them. In another embodiment, the protective layer may be formed in interconnect layers other than that immediately below the fuse. This allows two or more insulating layers to be present between the protective layer and the fuse. The combination of these insulating layers would be thicker and stronger than a single insulating layer. Thus, the combined insulating layers would be more resistant to rupturing and would enable the protective layer to absorb more radiant energy.

In another embodiment the protective layer may be formed with openings such as small holes or slits to further strengthen the insulating layer due to the additional attachment points to the layers underlying the protective layer. If these openings have at least one dimension which is less than the primary wavelength of the radiant energy, diffraction will significantly diffuse radiant energy which reaches the active circuitry below. The openings may also be placed generally under the fuses if the dimensions of the openings are small relative to the fuse width plus the radiant energy wavelength.

In another embodiment the fuse layer may have an anti-reflective coating where the fuses are formed. This enables the fuse to better absorb the radiant energy used to configure it.

BRIEF DESCRIPTION OF THE DRAWINGS

The present invention will be understood and appreciated more fully from the following detailed description taken in conjunction with the drawings in which.

DETAILED DESCRIPTION OF THE INVENTION

Figure 1:
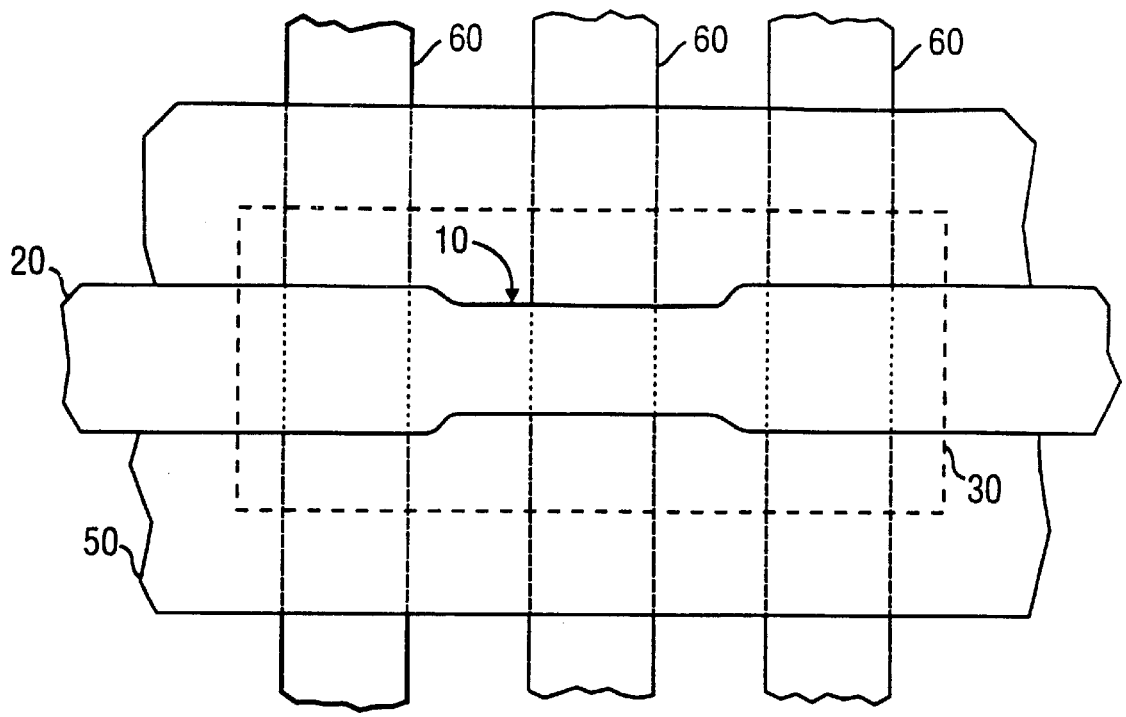
FIG. 1 is an illustrative top plan view of a portion of an integrated circuit with a protective layer over interconnect lines in accordance with one embodiment of the present invention.
Figure 2:
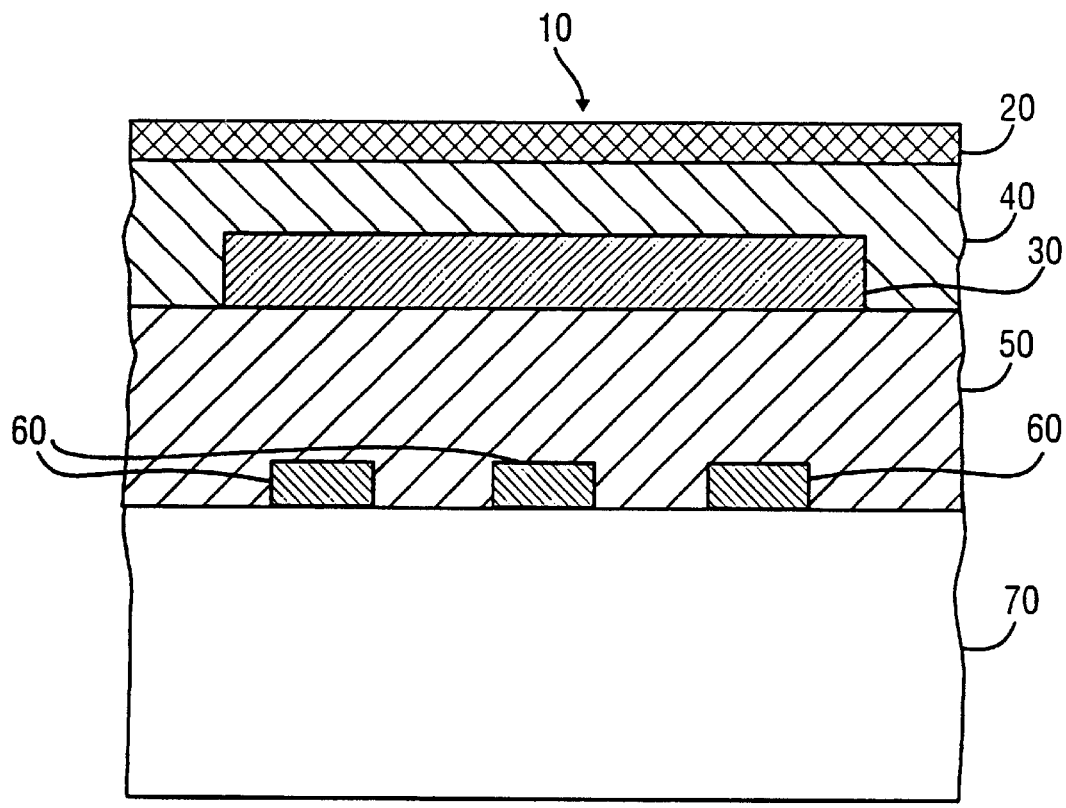
FIG. 2 is an illustrative front sectional view of the embodiment of the present invention illustrated in FIG. 1.

FIGS. 1 and 2 illustrate a portion of an integrated circuit with a protective layer 30 in accordance with the present invention. A semiconductor substrate 70, which may be of either an N-type or a P-type conductivity, is shown with interconnect lines 60 formed thereabove. Interconnect lines 60 are shown in FIGS. 1 and 2 for simplicity only. The present invention relates to the protection of active circuitry which may include interconnect lines 60, or any other circuit elements such as transistors, diodes, resistors, capacitors or even a P-well or N-well in an N-type or P-type semiconductor substrate respectively.

An insulating layer 50 is formed overlaying this active circuitry (interconnect lines 60). This insulating layer 50 is overlaying interconnect lines 60 and is formed with one or more dielectric layers. The insulating layer 50 may also be made of one or more different dielectric materials such as silicon dioxide and silicon nitride. The insulating layer 50 may be deposited using conventional and well known methods.

A fuse layer 20 is formed above the active circuitry (interconnect lines 60) with an insulating layer 40 and a protective layer 30 framed therebetween. This fuse layer 20 is formed having at least one fuse 10 which can be configured using radiant energy. Preferably, the fuse layer 20 will have a plurality of fuses 10 configurable using laser energy so that the integrated circuit can be customized or repaired. A programmable laser (not shown) is preferably used to configure these fuses.

As noted above, configuring refers to altering the structure, path, or electrical characteristics of the integrated circuit. For instance, for fuses this typically means electrically disconnecting (blowing) the conductor at the fuse location. Whereas, for an antifuse it typically means electrically connecting the conductor at the antifuse location. The fuse 10 of FIG. 1 is illustrative only and is not meant to be a physical representation of a fuse as that term is broadly used herein.

Figure 3:
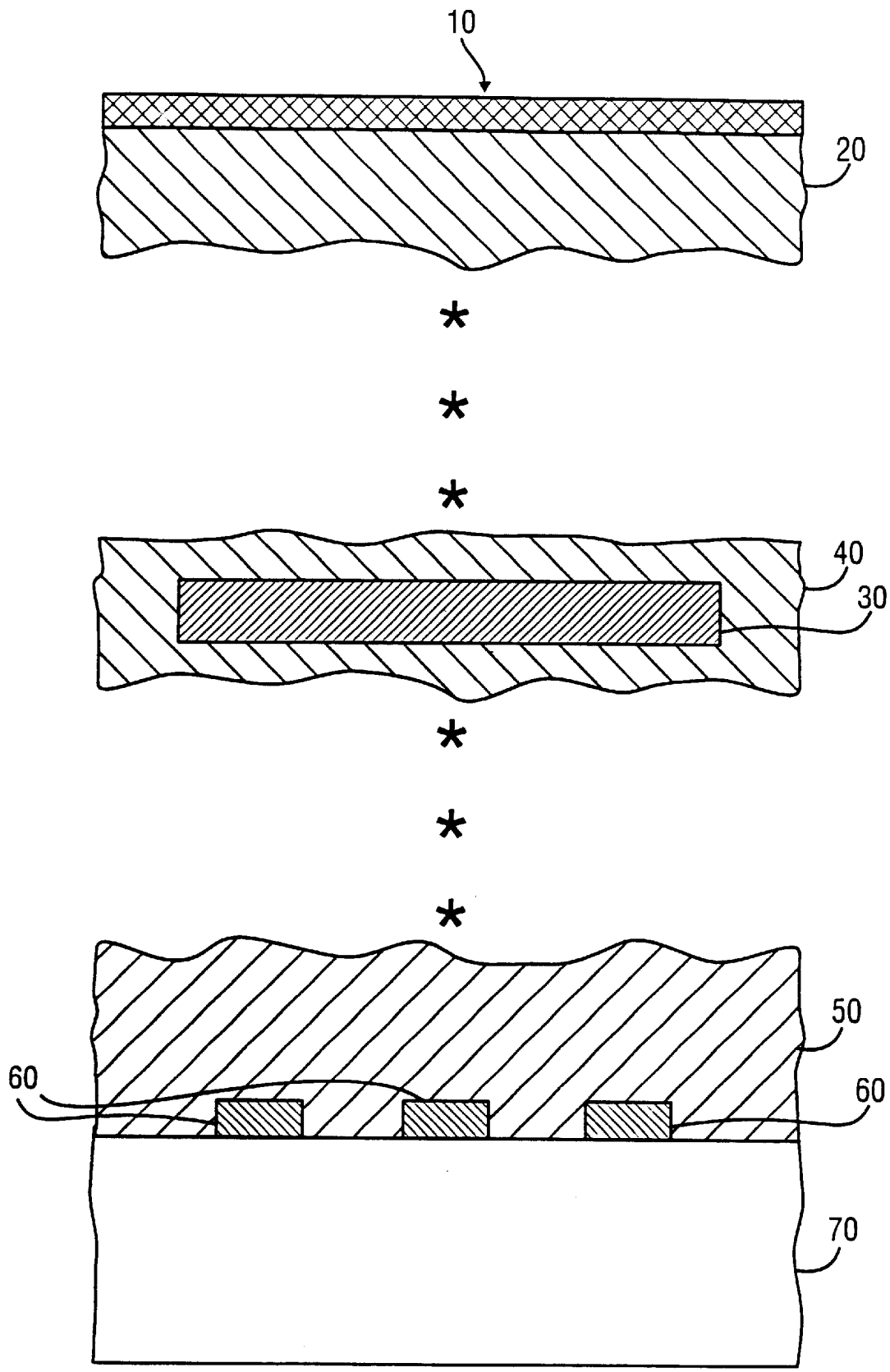
FIG. 3 is an illustrative front sectional view of another embodiment of the present invention.

The fuse layer 20 may be a multiple layer structure and may be made of materials such as aluminum (Al), compounds of aluminum such as AlSi or AlSiCu, tungsten (W), titanium (Ti) or its commonly used compounds such as titanium-tungsten (TiW) or titanium-nitride (TiN), silicides commonly used in the industry, or any other conductive material capable of forming radiant energy configurable fuses. The fuse layer 20 may also have an anti-reflective coating formed on the fuse 10 to better enable the fuse 10 to absorb the radiant energy used to configure the fuse 10. Titanium-nitride and titanium-tungsten are two such commonly used materials with anti-reflective properties. Although FIGS. 1 and 2 show only one fuse layer 20, the integrated circuit may have a plurality of interconnect layers as illustrated in FIG. 3, which are either configurable like the fuse layer 20 or not configurable like the interconnect lines 60. These additional interconnect layers may be formed between either the protective layer 30 and the fuse layer 20 or the protective layer 30 and the interconnect lines 60. When these additional interconnect layers are present is one situation where the insulating layer 50 and/or the insulating layer 40 will be made of more than one dielectric layer.

The protective layer 30 is formed underneath the fuse 10 of the fuse layer 20 as illustrated in FIGS. 1 and 2. A protective layer 30 is necessary when the fuse 10 is located such that the beam area of the radiant energy used to configure the fuse 10 overlaps active circuitry. The area of the protective layer 30 underneath the fuse 10 is determined based on the beam area of the radiant energy used to configure the fuse 10 and the active circuitry which the fuse 10 overlaps needing protection from any radiant energy not directly impinging on the fuse 10 when it is configured. Advantageously, the area of the protective layer 30 underneath the fuse 10 should be capable of shielding the active circuitry from at least about fifty-percent of the radiant energy not directly impinging on the fuse 10.

The protective layer 30 may be aluminum, titanium or any other material capable of shielding (by deflecting and/or absorbing) the radiant energy used to configure the fuse 10. It is desirable that the protective layer 30 be formed with a top surface more reflective than the top surface of the fuse 10. This will allow for the widest process window between the minimum energy required to blow fuse 10 and the maximum allowable energy to be directed at fuse 10 without damaging protective layer 30. The protective layer 30 may also be a combination of more than one material. For instance, different materials may be sandwiched together to better deflect and/or absorb the radiant energy used to configure the fuse 10, or to improve the mechanical or thermal behavior of the protective layer 30. The material used for the protective layer 30 will depend on the radiant energy used to configure the fuse 10. Laser energy is desirably used to configure the fuse 10.

The protective layer 30 may also be used as a conductive layer in the integrated circuit. Specifically, the protective layer 30 may provide conductive-ground or conductive-power connection in the integrated circuit or a signal line. The protective layer 30 may also be used as a capacitive element in the integrated circuit.

As shown in FIG. 2, the insulating layer 40 is formed between the fuse layer 20 and the protective layer 30. The insulating layer 40 may comprise one or more dielectric layers such as silicon dioxide or silicon nitride. Both the insulating layer 40 and the insulating layer 50 may or may not be planarized. Although FIG. 2 shows the protective layer 30 overlaying the insulating layer 50, as noted above, there may be other conductive layers between them outside of the radiation beam area used to configure the fuse 10.

FIG. 3 illustrates that there may be a plurality of interconnect layers (not shown) which are either configuable like fuse layer 20 or not configurable like interconnect lines 60. These additional interconnect layers may be formed above or below protective layer 30. This is one instance where insulating layer 40 or insulating layer 50 may be made up of more than one dielectric layer of one or more different dielectric materials. For instance, silicon dioxide and silicon nitride are commonly used dielectric materials which may be deposited using well known methods.

Figure 4:
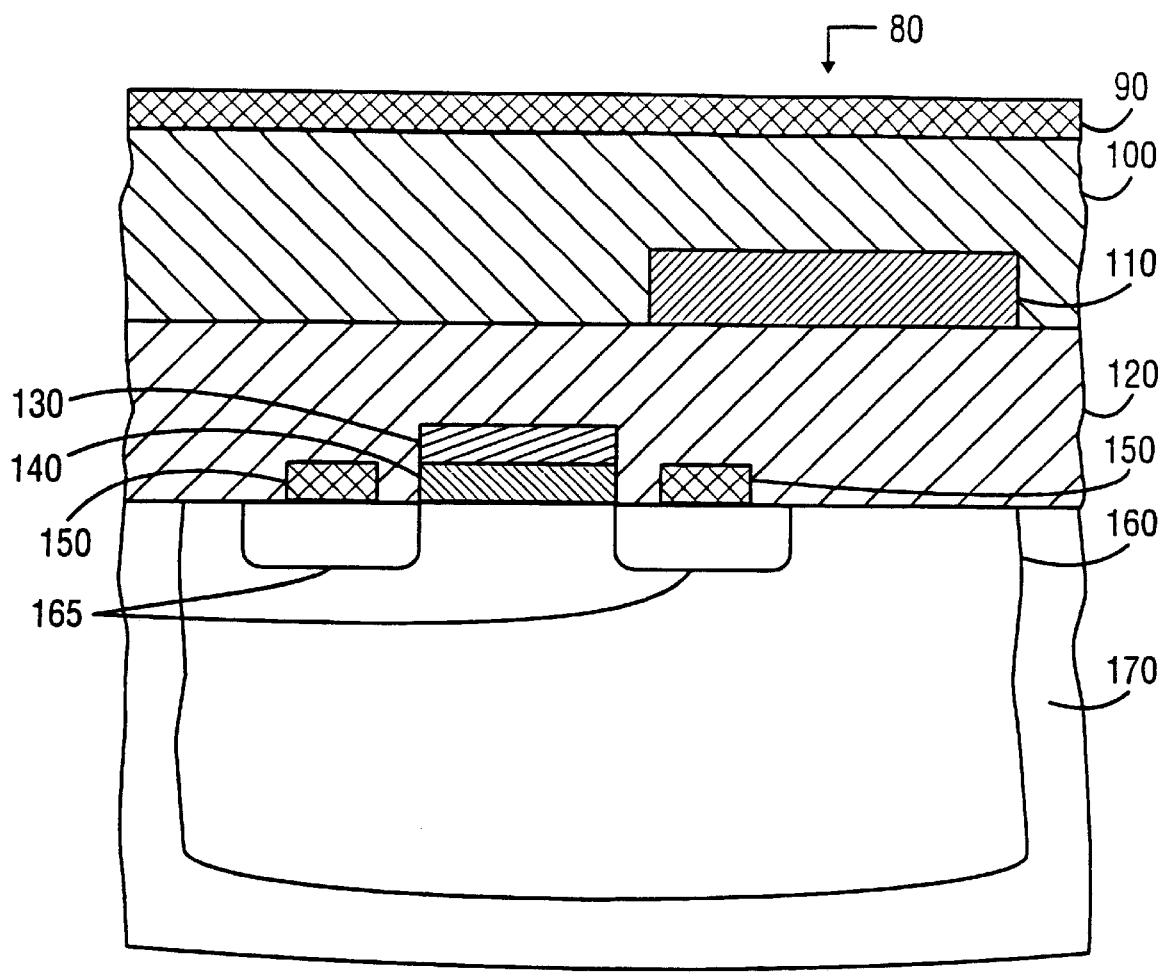
FIG. 4 is an illustrative front sectional view of a portion of an integrated circuit with a protective layer overlapping part of a MOS transistor in accordance with another embodiment of the present invention.
Figure 4A:
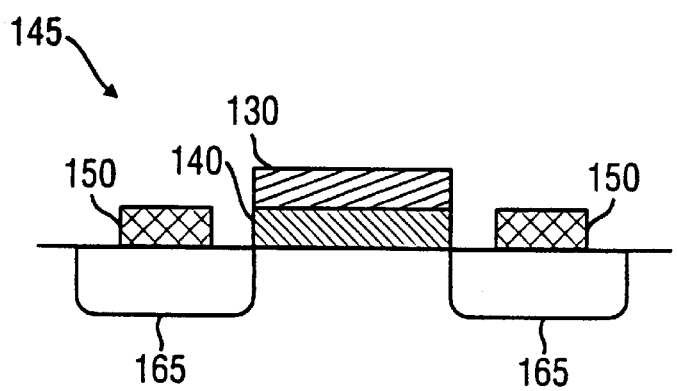
FIG. 4A is a front sectional view illustrating the MOS transistor of FIG. 4.

FIG. 4 illustrates a portion of an integrated circuit where a protective layer 110 is used to protect active circuitry other than the interconnect lines 60 of FIG. 1 and 2. A semiconductor substrate 170 may be of either a P-type or an N-type conductivity with a well 160 which may be formed of opposite conductivity (either N-type or P-type). Diffusion regions 165 are of opposite conductivity with respect to the well 160. Contacts 150 provide electrical connection to the diffusion regions 165. A gate 130 is made of polysilicon and a gate oxide 140 is made of a thermally grown silicon dioxide. These regions form an N-type or a P-type MOS transistor 145 (as shown in FIG. 4A) dependent on whether the semiconductor substrate 170 is N-type or P-type.

In this embodiment illustrated in FIG. 4, an insulating layer 120 similar to the insulating layer 50 of FIG. 2 is formed overlaying this active circuitry (MOS transistor 145). A fuse layer 90 similar to the fuse layer 20 of FIG. 2 is formed above the active circuitry (MOS transistor 145). This fuse layer 90 is formed having at least one fuse 80 similar to the fuse 10 of FIG. 2 which can be configured using radiant energy. Although FIG. 4 shows only one fuse layer 90, the integrated circuit may include a plurality of interconnect layers (not shown) similar to those illustrated in FIG. 3 which are either configurable like the fuse layer 90 or not configurable like the interconnect lines 60 of FIG. 1. These additional interconnect layers can be between either the protective layer 110 and the fuse layer 90 or the protective layer 110 and the MOS transistor 145.

The protective layer 110 of FIG. 4 is similar to the protective layer 30 of FIG. 2, and is formed underneath the fuse 80 of the fuse layer 90 as illustrated in FIG. 4. The area of the protective layer 110 underneath the fuse 80 is determined based on the beam area of the radiant energy used to configure the fuse 80 and the active circuitry which the fuse 80 overlaps needing protection from significant radiant energy not directly impinging on the fuse 80 when it is configured. Advantageously, the area of the protective layers 110 underneath the fuse 80 should be capable of shielding said active circuitry from at least about fifty-percent of the radiant energy not directly impinging on the fuse 80. FIG. 4 shows the protective layer 110 extended as far as the well 160 and need not extend over the semiconductor substrate 170 unless there is a need to protect the semiconductor substrate from the radiant energy used to configure the fuse 80.

Like the protective layer 30 of FIG. 2, the protective layer 110 may also be used as a conductive layer in the integrated circuit. Specifically, the protective layer 110 may provide a conductive-ground or conductive-power connection in the integrated circuit or a signal line. The protective layer 110 may also be used as part of a capacitive element of the integrated circuit.

An insulating layer 100 similar to the insulating layer 40 of FIG. 2 is formed between the fuse layer 90 and the protective layers 110. The insulating layer 100 may comprise one or more dhielectric layers such as silicon dioxide or silicon nitride. Both the insulating layer 100 and the insulating layer 120 may or may not be planarized.

Figure 5:
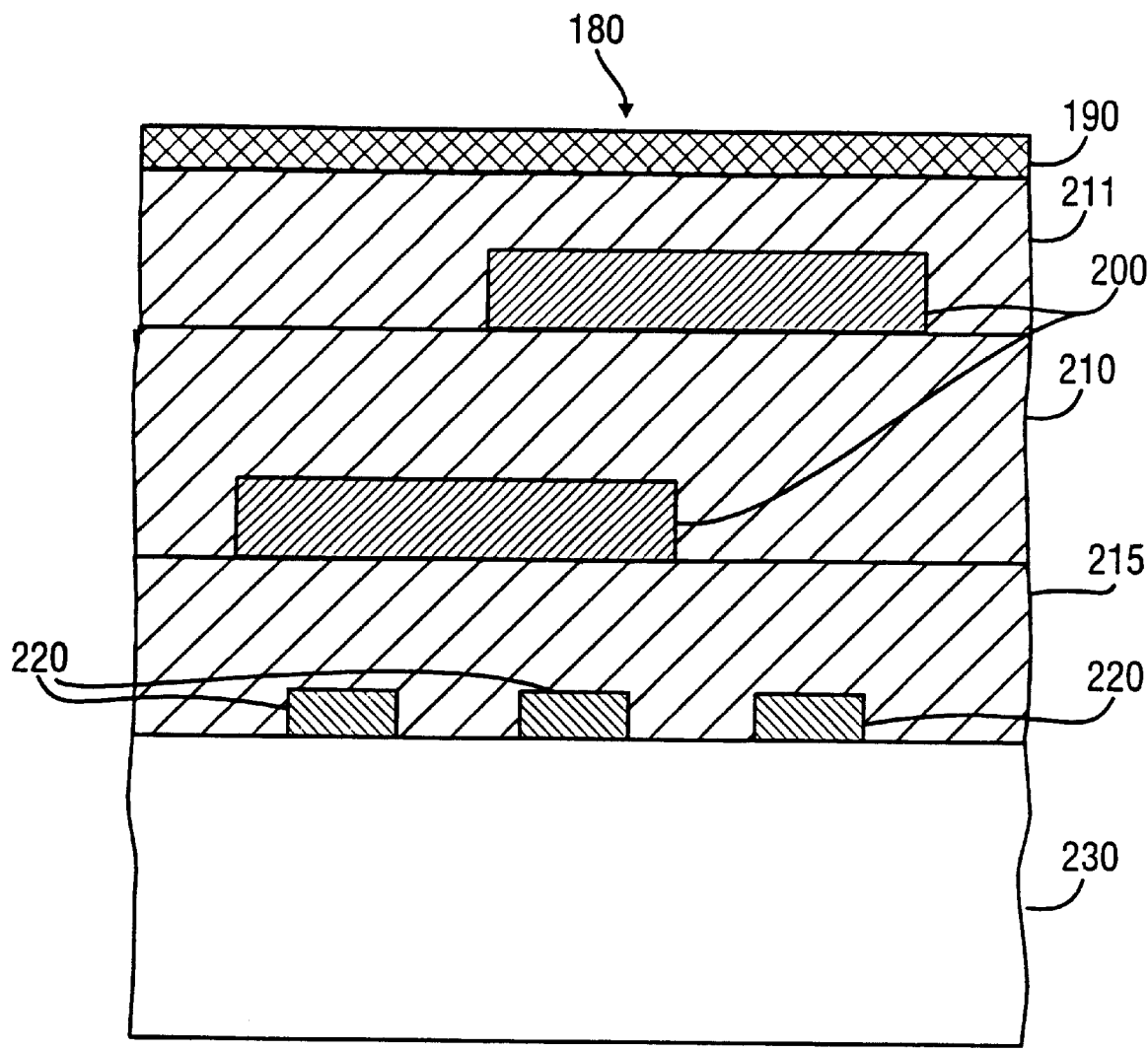
FIG. 5 is an illustrative front sectional view of a portion of an integrated circuit with more than one protective layer over interconnect lines in accordance with another embodiment of the present invention.
Figure 5A:
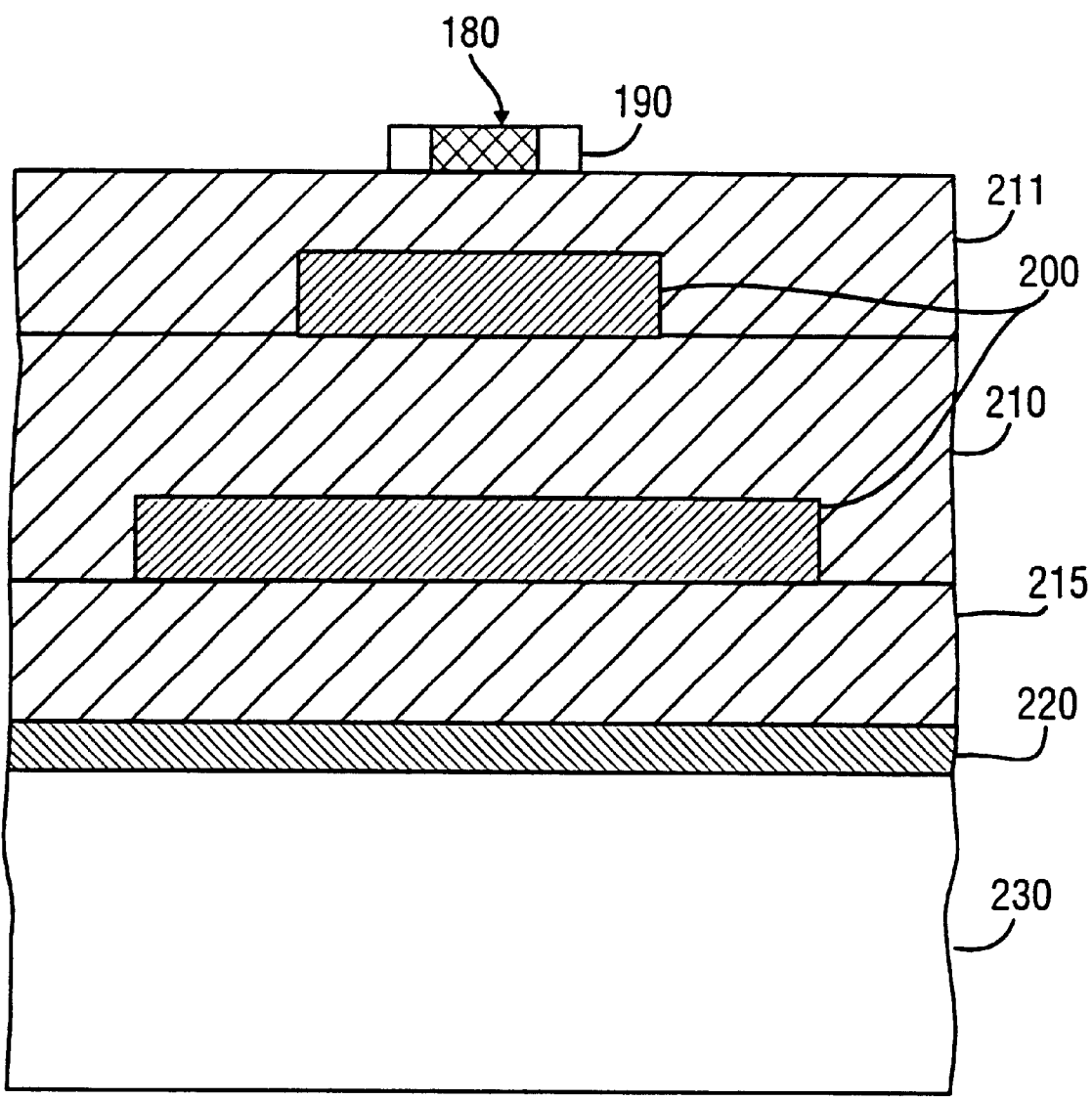
FIG. 5A is an illustrative side sectional view of the portion of an integrated circuit of FIG. 5.

FIGS. 5 and 5a illustrate another embodiment of the present invention with a portion of an integrated circuit that is similar to that shown in FIG. 2. The embodiment of FIGS. 5 and 5a differs from the embodiment of FIG. 2 primarily in that the portion of the integrated circuit has two protective layers 200. It is understood that more than two protective layers 200 may also be used. The components of the embodiment shown in FIGS. 5 and, 5a are similar to those shown in FIG. 2, with a semiconductor substrate 230 corresponding to the substrate 70, interconnect lines 220 corresponding to the interconnect lines 60, an insulating layer 215 corresponding to the insulating layer 50, another insulating layer 210 corresponding to the insulating layer 40, and a fuse layer 190 having at least one fuse 180 corresponding to the fuse layer 20 with the fuse 10. An additional insulating layer 211 is provided for the additional protective layer 200, and may generally be similar to the insulating layer 210 in structure and properties.

As in the embodiment of FIG. 2, the fuse layer 190 of FIGS. 5 and 5a desirably will have a plurality of fuses configurable using laser energy so that the integrated circuit can be customized or repaired. A programmable laser is desirably used to configure these fuses. Further, although FIGS. 5 and 5a show only one fuse layer 190, the integrated circuit may include a plurality of interconnect layers (not shown) similar to those illustrated in FIG. 3 which are either configurable like the fuse layer 190 or not configurable like the interconnect lines 220. These additional interconnect layers can be either between the protective layers 200 and the fuse layer 190 or between the protective layers 200 and the interconnect lines 220, as illustrated in FIG. 3.

The two protective layers 200 are similar to the protective layer 30 of FIG. 2 and are formed underneath the fuse 180 of the fuse layer 190 as illustrated in FIGS. 5 and, 5a. The protective layers 200 are necessary when the fuse 180 is located such that the beam area of the radiant energy used to configure the fuse 180 overlaps active circuitry. These protective layers 200, however, need not be aligned with each other or with the center of the fuse 180 as illustrated in FIG. 5, but they may be aligned. The area of each of the protective layers 200 underneath the fuse 180 are determined based on the beam area of the radiant energy used to configure the fuse 180 and the active circuitry which the fuse 180 overlaps needing protection from any radiant energy not directly impinging on the fuse 180 when it is configured. The area of each of these protective layers 200 need not be the same. Advantageously, the combined area of protective layers 200 underneath the fuse 180 should be capable of shielding said active circuitry from at least about fifty-percent of the radiant energy not directly impinging on the fuse 180.

The protective layers 200 will most advantageously have top surfaces that are more reflective than the top surface of the fuse 180. In this manner the protective layers 200 or a single protective layer 200 (FIG. 2) need thermally absorb less energy without damage for any level of radiant energy beam used to configure the fuse 180 in the multiple protective layer case shown in FIG. 5 or the fuse 10 of the single protective layer case of FIG. 2.

The radiant energy used to configure the fuse 180 can be broken into five components. The first component is that portion of the energy that is reflected off the top surface of the fuse 180, while the second component is the energy absorbed by the fuse 180 which causes it to be configured. The third component is the portion that does not impinge upon the fuse 180 and is reflected by the protective layers 200. The fourth component is absorbed by the protective layers 200. The fifth and final component does not impinge upon either the fuse 180 or the protective layers 200, and is allowed to impinge upon the active circuitry 220 and semiconductor substrate 230 below.

The only portion of the radiant energy beam that must be absorbed by the protective layers 200 to avoid causing damage to the underlying active circuitry is the fourth component. This fourth component energy will be transformed into heat as it is absorbed by the protective layers 200. One benefit of using two protective layers is that it allows this fourth component energy to be spread by thermal conduction over a larger combined plate area, with a larger thermal mass than a single layer plate of equivalent horizontal dimensions. This can allow a stronger radiant energy pulse or pulses to be used in configuring the fuse 180, or can allow for the use of less reflective protective layers 200. An example would be for the upper protective layer 200 to extend beyond each side of the fuse 180 by a dimension equal to one half of the width of the fuse 180, and for the lower protective layer 200 to extend beyond each side of the upper protective layer 200 by an additional width of the fuse 180 (similar to what is shown in FIG. 5A but not to scale). In this example, the radiant energy not directly impinging upon the fuse 180 to a distance of one and one half widths of the fuse 180 to either side of the fuse 180 will be absorbed by the two protective layers 200, and will be absorbed thermally across a protective layer area of six times the width of the fuse 180 rather than just the area of four times the width of the fuse 180 if the protective layer 200 were a single plate.

Like the protective layer 30 of FIG. 2, the protective layers 200 of FIGS. 5 and 5a may also be used as a conductive layer in the integrated circuit. Specifically, protective layers 200 may provide a conductive-ground or conductive-power connection in the integrated circuit or a signal line. The protective layers 200 may also be used to form a capacitive element in the integrated circuit.

Figure 6:
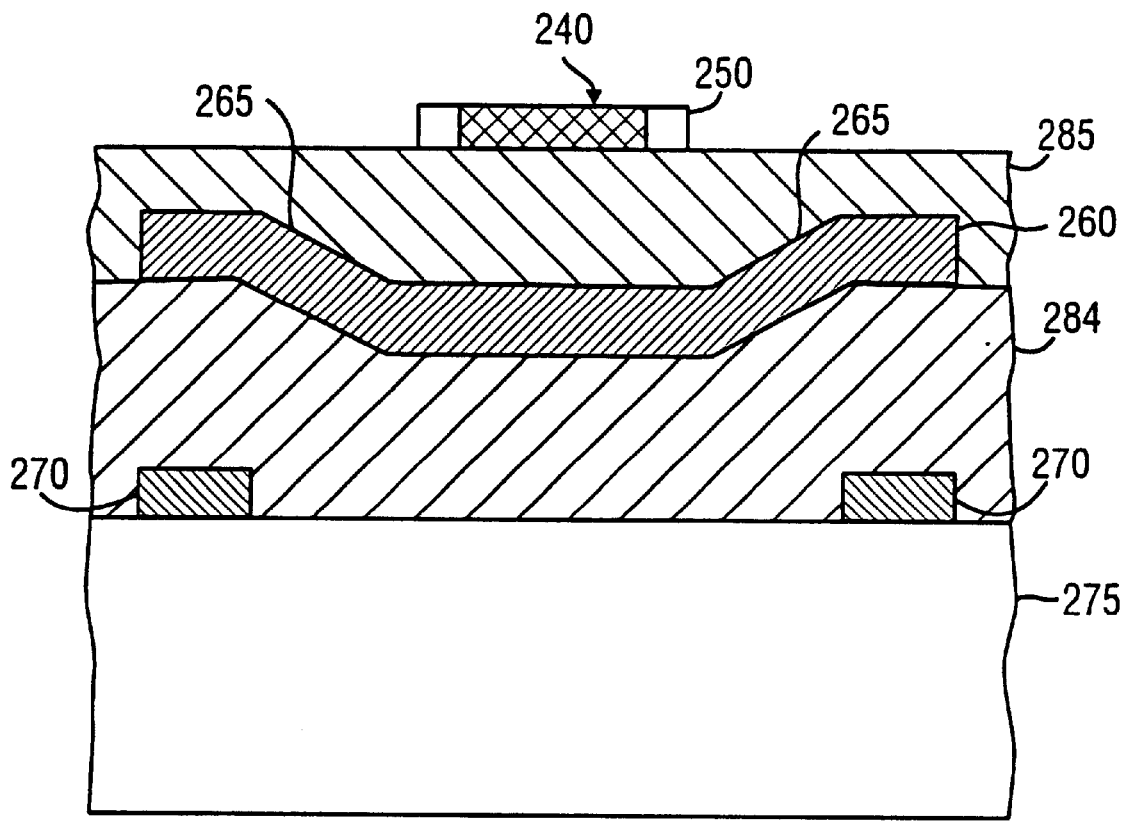
FIG. 6 is an illustrative front sectional view of a portion of an integrated circuit with a protective layer having tilted sides in accordance with yet another embodiment of the present invention.
Figure 7:
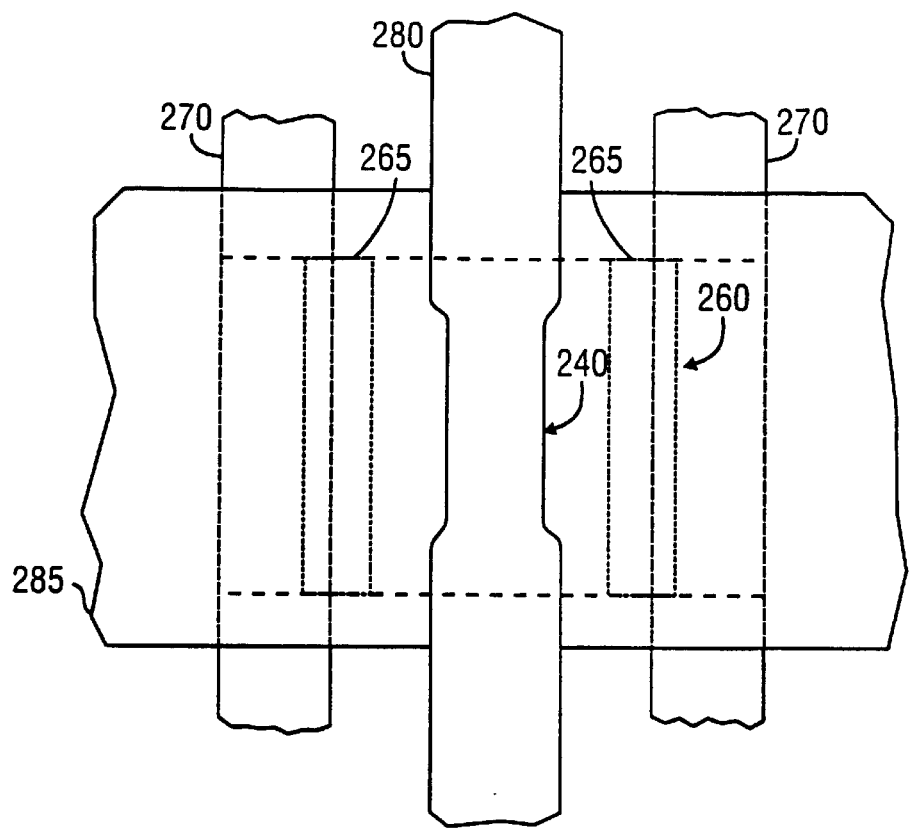
FIG. 7 is an illustrative top plan view of one embodiment of the present invention illustrated in FIG. 6.

FIGS. 6 and 7 illustrate yet another embodiment of the present invention. The portion of an integrated circuit shown in FIGS. 6 and 7 is similar to that of FIG. 2, with a semiconductor substrate 275 corresponding to the substrate 70, interconnect lines 270 corresponding to the interconnect lines 60, an insulating layer 285 corresponding to the insulating layer 40, another insulating layer 284 corresponding to the insulating layer 50, and a fuse layer 250 having at least one fuse 240 corresponding to the fuse layer 20 with the fuse 10.

The embodiment of FIGS. 6 and 7 differs from the embodiment of FIG. 2 primarily in that the protective layer 260 in FIGS. 6 and 7 is formed so that it is tilted from the horizontal on one or both sides. FIG. 6 illustrates both of the sides 265 tilted from the horizontal. This causes a portion of the radiant energy that misses the fuse 240 to be reflected back to the underside of the fuse 240. The range of angles by which the sides 265 of protective layer 260 should be tilted depends on the thickness of the insulating layer 285. The sides 265 advantageously should be tilted at an angle to deflect a portion of the radiant energy to the underside of the fuse 240 and not the area outside the fuse 240 of the fuse layer 250. Forming the protective layer 260 with the sides 265 tilted may be accomplished using well known techniques. For instance, one may employ isotropic etching of the underlying insulating layer 284 with or without reflow or a similar step, or the placement of additional structures (similar to the interconnect lines 270) under the protective layer 260, and also using a conformal insulating layer 284 such that the sides 285 of the protective layer 260 are tilted from the horizontal.

FIGS. 6 and 7 show the orientation of the fuse layer 250 different from that of the fuse layer 20 of FIG. 2. Although the fuse layer 250 may be oriented in a similar manner as the fuse layer 20, the orientation shown in FIGS. 6 and 7 advantageously allows the effect of the deflection of a portion of the radiant energy by the tilted sides 265 of the protective layer 260 to be enhanced.

Like the protective layer 30 of FIG. 2, the protective layer 260 in FIGS. 6 and 7 is formed underneath and aligned with the fuse 240 of the fuse layer 250 as illustrated in FIG. 6. The protective layer 260 is necessary when the fuse 240 is located such that the beam area of the radiant energy used to configure the fuse 240 overlaps active circuitry. The area of the protective layer 260 underneath the fuse 240 is determined based on the beam area of the radiant energy used to configure the fuse 240 and the active circuitry which the fuse 240 overlaps that needing protection from any radiant energy not directly impinging on the fuse 240 when it is configured. Advantageously, the area of the protective layer 260 underneath the fuse 240 should be capable of shielding the active circuitry from at least about fifty-percent of the radiant energy not directly impinging on the fuse 240. The protective layer 260 may be similar in material to the protective layer 30 of FIG. 2. Further, the protective layer 260 may also be used as a conductive layer in the integrated circuit. Specifically, the protective layer 260 may provide a conductive-ground or conductive-power connection in the integrated circuit or a signal line. The protective layer 260 may also be used to form a capacitive element in the integrated circuit.

In addition, although FIGS. 6 and 7 show only one fuse layer 250, the integrated circuit may include a plurality of interconnect layers (not shown) similar to those illustrated in FIG. 3 which are either configurable like the fuse layer 250 or not configurable like the interconnect lines 270. The additional interconnect layers can be either between the protective layer 260 and the fuse layer 250 or between the protective layer 260 and the interconnect lines 270, as illustrated in FIG. 3.

Figure 8:
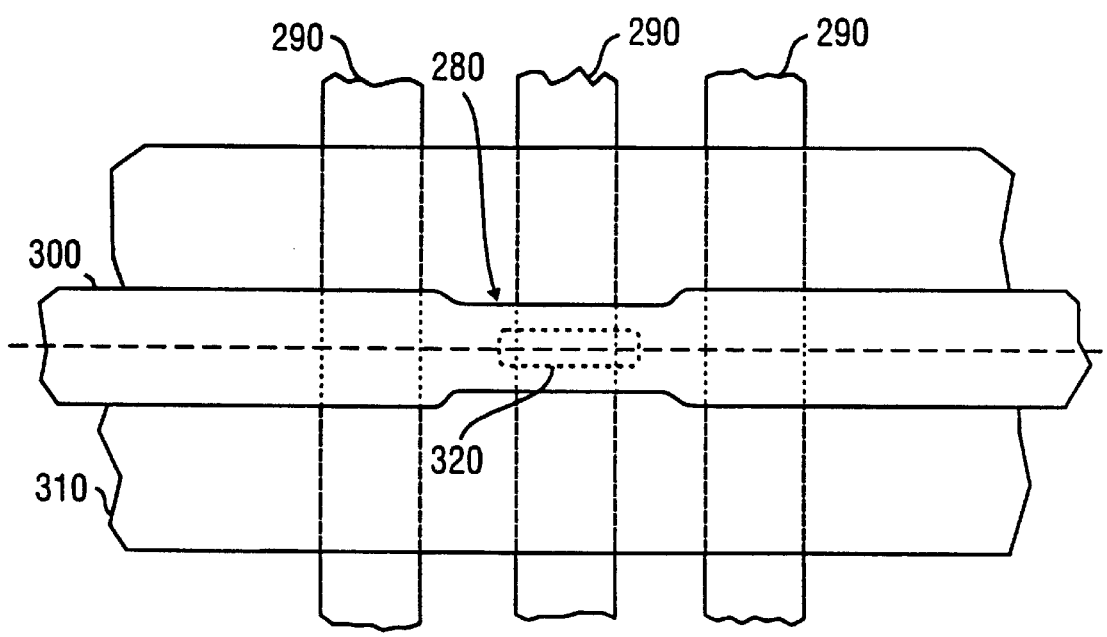
FIG. 8 is an illustrative top plan view of a portion of an integrated circuit with a protective layer having openings in accordance with yet another embodiment of the present invention.

FIG. 8 illustrates another embodiment of the present invention. The portion of an integrated circuit of FIG. 8 is similar to that illustrated in FIG. 2, with a semiconductor substrate (not shown) corresponding to the semiconductor substrate 70, interconnect lines 290 corresponding to the interconnect lines 60, an insulating layer (not shown) corresponding to the insulating layer 50 and overlaying the active circuitry (interconnect lines 290), and a fuse layer 300 having at least one fuse 280 corresponding to the fuse layer 20 with the fuse 10 and formed above the active circuitry (interconnect lines 290).

In the embodiment of FIG. 8, a protective layer 310 similar to the protective layer 30 of FIG. 2 is formed with one or more openings to increase the overall adhesive strength of insulating layer (not shown) disposed between the protective layer 310 and the fuse layer 300. These openings may be shaped as the slot 320 shown in FIG. 8 but they may also be holes of different shapes. Advantageously, these slots 320 should have at least one dimension less than or equal to the wavelength of the radiant energy used to configure the fuse 280. The slot 320 may be placed generally under the fuse 280 as shown in FIG. 8, if at least one dimension of the opening 320 is small relative to the width of the fuse 280 plus the radiant energy wavelength. The slots 320 will then diffuse any radiant energy not deflected by the protective layer 310. To maximize the increase in strength of the insulating layer, the slots 320 should be formed underneath the center line of the fuse 280 but not necessarily aligned with fuse 280 as illustrated in FIG. 8. These openings (slots 320) may be formed using conventional methods. For instance, they may be formed using known photoresist masking and/or etching techniques.

Although FIG. 8 shows only one first layer 300, the integrated circuit may include a plurality of interconnect layers (not shown) similar to those illustrated in FIG. 3 which are either configurable like the fuse layer 300 or not configurable like the interconnect lines 290. These additional interconnect layers can be between either the protective layer 310 and the fuse layer 300 or the protective layers 310 and the interconnect lines 290.

Like the protective layer 30 of FIG. 2, the protective layer 310 of FIG. 8 is formed underneath the fuse 280 of the fuse layer 300. The area of the protective layer 310 underneath the fuse 280 is determined based on the beam area of the radiant energy used to configure the fuse 280 and the active circuitry which the fuse 280 needing protection from any radiant energy not directly impinging on the fuse 280 when it is configured. Advantageously, the area of the protective layers 310 underneath the fuse 280 should be capable of shielding said active circuitry from at least about fifty-percent of the radiant energy not directly impinging on the fuse 280. The protective layer 310 may also be used as a conductive layer in the integrated circuit. Specifically, the protective layer 310 may provide conductive-ground or conductive-power connection in the integrated circuit or a signal line. The protective layer 310 may also be used as part of a capacitive element of the integrated circuit.

In the embodiment of FIG. 8, another insulating layer (not shown) corresponding to the insulating layer 40 of FIG. 2 is formed between the fuse layer 300 and the protective layers 310. This insulating layer may comprise one or more dielectric layers such as silicon dioxide or silicon nitride. Both this insulating layer and the insulating layer below protective layer 310 may or may not be planarized.

Having now fully described the invention, it will be apparent to one of ordinary skill in the art that many changes and modifications can be made thereto without departing from the spirit or scope of the invention as set forth herein.

What is claimed is:

1. An integrated circuit comprising:
   (a) active circuitry;
   (b) a first insulating layer, said first insulating layer overlaying said active circuitry;
   (c) a fuse element above said first insulating layer, said fuse element comprising a radiant-energy configurable fuse having a location such that the beam area of the radiant energy used to configure said fuse overlaps said active circuitry;
   (d) a multi-metal protective layer underneath said fuse element, said protective layer sufficiently large to shield said active circuitry from said radiant energy not directly impinging upon said fuse element; and
   (e) a second insulating layer between said protective layer and said fuse element.

2. The integrated circuit of claim 1 wherein said multi-metal protective layer is electrically connected with a portion of said active circuitry to form a conductive path in said integrated circuit.

3. The integrated circuit of claim 2 wherein said multi-metal protective layer is a power supply path or a ground path in said integrated circuit.

4. The integrated circuit of claim 1 wherein a top surface of said multi-metal protective layer is more reflective of said radiant energy than is an upper surface of said fuse element.

5. An integrated circuit comprising:
   (a) a substrate including active circuitry;
   (b) a radiant-energy configurable fuse element overlying said substrate;
   (c) at least an upper and a lower protective layer disposed between said substrate and said fuse element to shield at least a portion of said substrate from radiant energy used to configure said fuse element;
   (d) a first insulating layer disposed between said substrate and said lower protective layer; and
   (e) a second insulating layer disposed between said upper protective layer and said fuse element;
   wherein at least a portion of an upper-most surface of said upper protective layer is tilted at an angle with respect to said substrate.

6. The integrated circuit of claim 5 wherein said portion of said upper-most surface is tilted at an angle to cause said radiant energy to be reflected back toward an underneath side of said fuse element.

7. The integrated circuit of claim 5 wherein at least one of said upper and lower protective layers is electrically connected as part of said integrated circuit.

8. The integrated circuit of claim 5 further comprising:
(f) a third insulating layer disposed between said upper and lower protective layers.

9. The integrated circuit of claim 8 wherein said upper and lower protective layers are electrically coupled as part of a capacitor structure electrically connected to said integrated circuit.

* * * * *